(12) United States Patent
Costa et al.

(10) Patent No.: US 8,883,589 B2
(45) Date of Patent: Nov. 11, 2014

(54) COUNTER DOPING COMPENSATION METHODS TO IMPROVE DIODE PERFORMANCE

(75) Inventors: Xiying Costa, San Jose, CA (US); Abhijit Bandyopadhyay, San Jose, CA (US); Kun Hou, Milpitas, CA (US); Brian Le, San Jose, CA (US); Yung-Tin Chen, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 609 days.

(21) Appl. No.: 12/892,633

(22) Filed: Sep. 28, 2010

(65) Prior Publication Data

US 2012/0074367 A1 Mar. 29, 2012

(51) Int. Cl.
| H01L 21/8234 | (2006.01) |
| H01L 27/24 | (2006.01) |
| H01L 27/102 | (2006.01) |
| H01L 45/00 | (2006.01) |

(52) U.S. Cl.
CPC ......... *H01L 27/1021* (2013.01); *H01L 45/1233* (2013.01); *H01L 45/1675* (2013.01); *H01L 27/2409* (2013.01); *H01L 45/149* (2013.01); *H01L 27/2481* (2013.01); *H01L 45/04* (2013.01)
USPC ..... 438/237; 438/514; 257/656; 257/E29.336

(58) Field of Classification Search
USPC .......... 438/237, 328, 914, 915, 514; 257/656, 257/E29.336
See application file for complete search history.

(56) References Cited

U.S. PATENT DOCUMENTS

| 5,915,167 A | 6/1999 | Leedy |
| 6,034,882 A | 3/2000 | Johnson et al. |
| 6,617,192 B1 * | 9/2003 | Lowrey et al. ................. 438/95 |
| 6,952,030 B2 | 10/2005 | Herner et al. |
| 7,176,064 B2 | 2/2007 | Herner |
| 7,405,465 B2 | 7/2008 | Herner |
| 7,767,499 B2 | 8/2010 | Herner |
| 8,183,665 B2 | 5/2012 | Bertin et al. |
| 2003/0203585 A1 * | 10/2003 | Hsu .............................. 438/385 |
| 2005/0001232 A1 | 1/2005 | Bhattacharyya |
| 2005/0158950 A1 * | 7/2005 | Scheuerlein et al. ......... 438/257 |
| 2007/0029607 A1 | 2/2007 | Kouznetzov |
| 2009/0072341 A1 | 3/2009 | Liu et al. |
| 2009/0168491 A1 | 7/2009 | Schricker et al. |

(Continued)

FOREIGN PATENT DOCUMENTS

| DE | 1104075 | 4/2011 |
| JP | 2002368252 | 12/2002 |

(Continued)

OTHER PUBLICATIONS

Office Action in related U.S. Appl. No. 12/654,927 (3590-372) mailed Jan. 30, 2013.

(Continued)

*Primary Examiner* — Benjamin Sandvik
*Assistant Examiner* — Leslie Pilar Cruz
(74) *Attorney, Agent, or Firm* — Dugan & Dugan, PC

(57) ABSTRACT

A method of forming a memory cell is provided, the method including forming a diode including a first region having a first conductivity type, counter-doping the diode to change the first region to a second conductivity type, and forming a memory element coupled in series with the diode. Other aspects are also provided.

47 Claims, 17 Drawing Sheets

(56) References Cited

U.S. PATENT DOCUMENTS

| | | | |
|---|---|---|---|
| 2009/0251940 A1* | 10/2009 | Ito | 365/51 |
| 2009/0268508 A1 | 10/2009 | Chen et al. | |
| 2010/0006812 A1 | 1/2010 | Xu et al. | |
| 2010/0012912 A1 | 1/2010 | Schricker | |
| 2010/0032638 A1 | 2/2010 | Xu | |
| 2010/0062573 A1 | 3/2010 | Gossner et al. | |
| 2011/0136327 A1* | 6/2011 | Han et al. | 438/488 |
| 2011/0169126 A1 | 7/2011 | Chen et al. | |

FOREIGN PATENT DOCUMENTS

| | | |
|---|---|---|
| JP | 2004335758 | 11/2004 |
| WO | WO 03/034498 | 4/2003 |
| WO | WO 2011/085054 | 7/2011 |

OTHER PUBLICATIONS

Feb. 21, 2013 Reply to Jan. 30, 2013 Office Action in related U.S. Appl. No. 12/654,927 (3590-372).

Strass, A. et al., "Low temperature electrical surface passivation of MBE-grown pin diodes by hydrogen and oxygen plasma processes", Thin Solid Films, vol. 321, No. 1-2, May 26, 1998, pp. 261-264.

Lee, J., et al., Hydrogen passivation of visible p-i-n type thin-film light-emitting diodes:, Applied Physics Letters, vol. 68, No. 8, Feb. 19, 1996, pp. 1031-1033.

Notice of Allowance in related U.S. Appl. No. 12/654,927 (3590-372) mailed Mar. 11, 2013.

Restriction Requirement in related U.S. Appl. No. 12/654,927 (3590-372) mailed Oct. 4, 2012.

Oct. 12, 2012 Reply to Oct. 4, 2012 Restriction Requirement in related U.S. Appl. No. 12/654,927 (3590-372).

Chen et al., "Passivation Effect of Poly-Si Thin-Film Transistors with Fluorine-Ion-Implanted Spacers," IEEE Electron Device Letters, vol. 29, No. 6, Jun. 2008, pp. 603-605.

Kim et al., "Poly-Si TFT Fabricated by Laser-Induced In-Situ Fluorine Passivation and Laser Doping," IEEE Electron Device Letters, vol. 22, No. 8, Aug. 2001, pp. 396-398.

Aleksandrova et al., "Characteristics of Polysilicon TFTs, Hydrogenated by Ion Implantation P-Channel," Journal of Optoelectronics & Advanced Materials, vol. 7, No. 1, Feb. 2005, pp. 313-316.

International Search Report and Written Opinion of counterpart International Application No. PCT/US2011/051988 mailed Dec. 6, 2011.

Mell, H. et al. "Erbium electroluminescence in forward-biased amorphous silicon p-i-n diodes", Physica Status Solidi C Wiley-VCH Germany, No. 5, pp. 1292-1299 (2004).

Dimitriadis, C.A. et al. "Electrical properties of polysilicon n+-i-p junctions", Semiconductor Science and Technology, IOP Publishing Ltd, GB, vol. 3, No. 6, pp. 558-563 (1988).

Amrani, M et al. "Experimental study and two-dimensional modeling of avalanche breakdown voltage in polycrystalline silicon p-n junctions" Journal of Applied Physics, vol. 101, No. 10, pp. 104509-1-104509-10 (2007).

Lombardo, S. et al. "Doping of semi-insulating polycrystalline silicon by B, P, and as implantation and diffusion", Journal of Applied Physics, American Institute of Physics. New York, US, vol. 75, No. 1 pp. 345-350 (1994).

Mercha et al., Grain Boundary Trap Passivation in Polysilicon Thin Film Transistor Investigated by Low Frequency Noise, 2001, Thin Solid Films, 383, pp. 303-306.

* cited by examiner

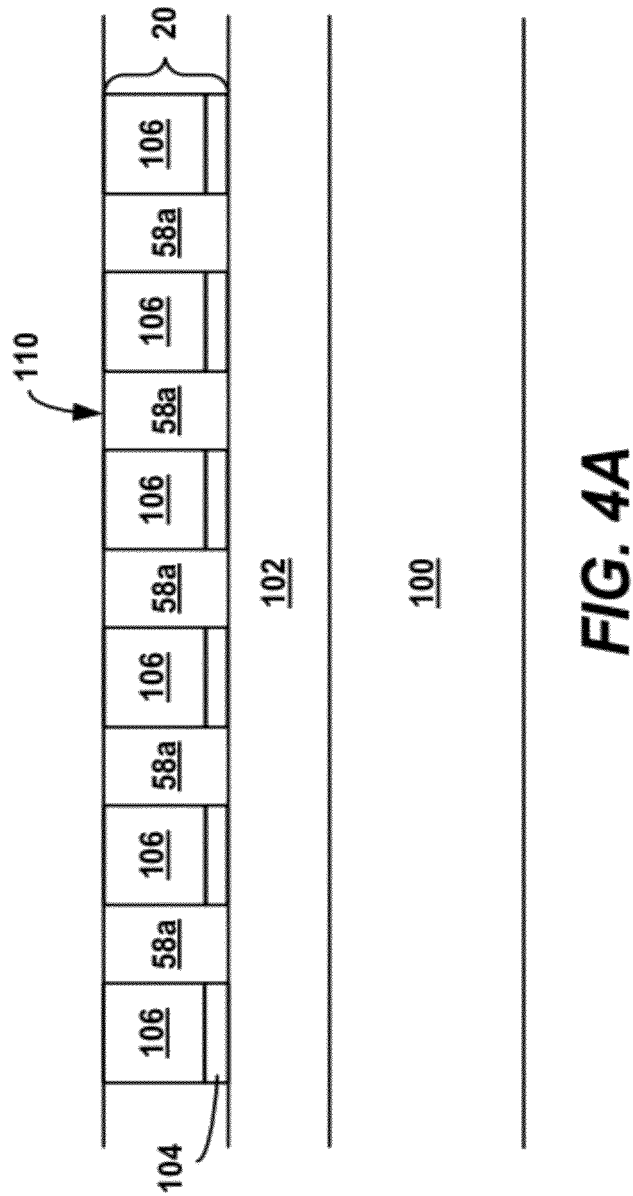

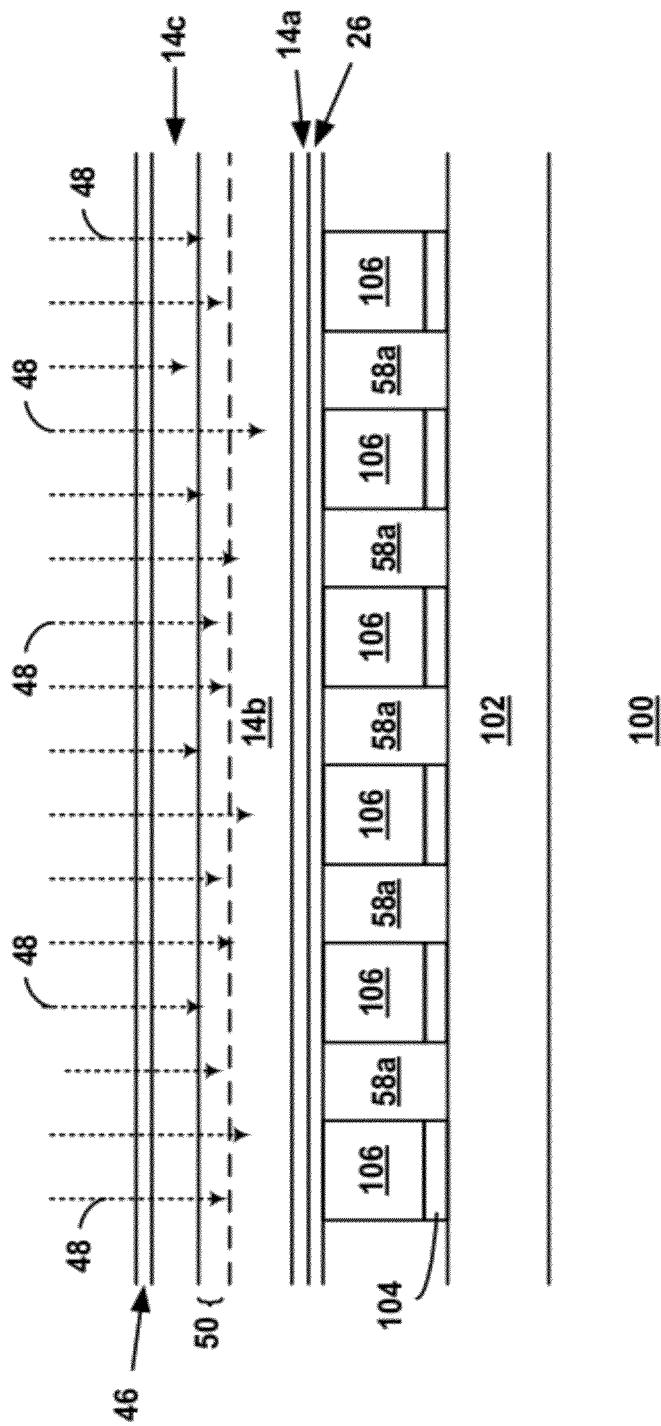

COUNTER DOPING COMPENSATION METHODS TO IMPROVE DIODE PERFORMANCE

CROSS-REFERENCE TO RELATED APPLICATIONS

This application is related to U.S. patent application Ser. No. 12/654,927, filed Jan. 8, 2010, now U.S. Pat. No. 8,450, 181, titled "In-Situ Passivation Methods To Improve Performance Of Polysilicon Diode" (referred to herein as "the '927 application"), which is incorporated by reference herein in its entirety for all purposes.

TECHNICAL FIELD

This invention relates to non-volatile memories, and more particularly to nonvolatile memory devices that include diode steering elements.

BACKGROUND

Non-volatile memories that include diode steering elements are known. For example, U.S. patent application Ser. No. 11/968,154, filed Dec. 31, 2007, and titled "Memory Cell That Employs A Selectively Fabricated Carbon Nano-Tube Reversible Resistance Switching Element And Methods Of Forming The Same," (the "'154 Application"), which is incorporated by reference herein in its entirety for all purposes, describes a rewriteable non-volatile memory cell that includes a diode coupled in series with a memory element. In particular, the memory element includes a carbon-based reversible resistivity-switching material.

However, fabricating memory devices that include diode steering elements is technically challenging, and improved methods of forming memory devices that include diode steering elements are desirable.

SUMMARY

In a first aspect of the invention, a method of forming a memory cell is provided, the method including forming a diode including a first region having a first conductivity type, counter-doping the diode to change the first region to a second conductivity type, and forming a memory element coupled in series with the diode.

In a second aspect of the invention, a method of forming a memory cell is provided, the method including forming a diode including a first region having a first conductivity type, counter-doping the first region to reduce trap effects along grain boundaries, and forming a memory element coupled in series with the diode.

In a third aspect of the invention, a memory cell is provided, the memory cell including a diode comprising a first region counter-doped from a first conductivity type to a second conductivity type, and a memory element coupled in series with the diode.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 4A-4K illustrate cross-sectional views of a portion of a substrate during an exemplary fabrication of a single memory level in accordance with this invention.

DETAILED DESCRIPTION

Figure 1:
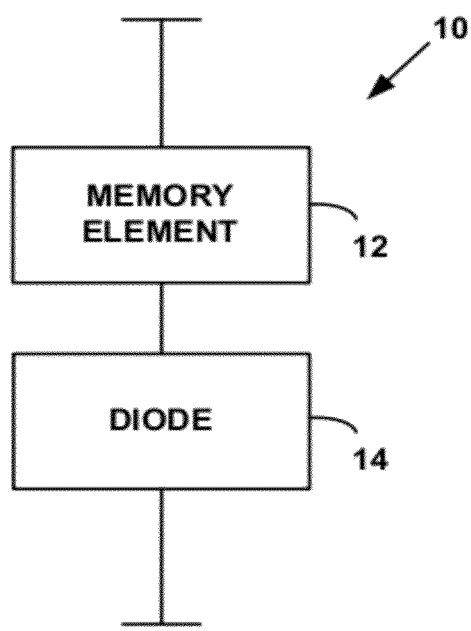
FIG. 1 is diagram of a previously known memory cell.

Referring to FIG. 1, a block diagram illustrating a prior art memory cell 10 is shown. Memory cell 10 includes a memory element 12, such as a reversible resistivity-switching element, coupled in series with diode 14, such as a polysilicon p-i-n diode. Memory element 12 can be above or below diode 14. In a three-dimensional architecture, diode 14 is typically vertically oriented.

Ideally, the intrinsic region in a p-i-n diode, such as diode 14, is electrically neutral. In practice, however, the intrinsic region will always have defects and/or contaminants that cause it to behave as if slightly n-type or p-type. In addition, diode 14 ideally should have a high forward current and zero reverse leakage current. In practice, however, conventional polysilicon diodes have high reverse leakage current and low forward current, which impair the operation of memory cell 10.

Without wanting to be bound by any particular theory, it is believed that high reverse leakage current and low forward current of prior art p-i-n diodes are at least partially the result of traps at interfaces between the intrinsic semiconductor region of the diode and the p-type and n-type semiconductor regions of the diode.

In addition, for prior art polysilicon diodes, it is believed that high reverse leakage current and low forward current of prior art p-i-n diodes are at least partially the result of traps along grain boundaries in the polysilicon diode.

The '927 application describes, among other things, methods for in-situ passivation of traps along one or more interfaces and along grain boundaries in a diode using a passivating dopant to reduce the number of traps within a diode. Although the techniques described in the '927 application are very effective at reducing the number of traps within a diode, the techniques do not completely eliminate traps within the diode.

Without wanting to be bound by any particular theory, it is believed that the residual traps along grain boundaries may contribute to high reverse leakage current and low forward current in the diode. In particular, if the intrinsic region of a p-i-n diode is slightly n-type, it is believed that high reverse leakage current and low forward current of prior art p-i-n diodes are at least partially the result of acceptor traps along grain boundaries in the slightly n-type intrinsic region.

Indeed, it is believed that the negative effects of acceptor traps are more pronounced if intrinsic region 14b is slightly n-type rather than slightly p-type.

Thus, as described in more detail below, methods in accordance with this invention use counter doping compensation techniques to compensate a slightly n-type intrinsic region to slightly p-type to reduce the effects of traps along grain boundaries in diodes. In particular, methods in accordance with this invention form a diode including a first region (e.g., an intrinsic region) having a first conductivity type (e.g., n-type), and counter dope the diode to change the first region to a second conductivity type (e.g., p-type).

Without wanting to be bound by any particular theory, it is believed that such counter doping compensation techniques improve the performance (e.g., increase the forward current and/or reduce the reverse leakage current) of diodes fabricated using such techniques.

Figure 2A:
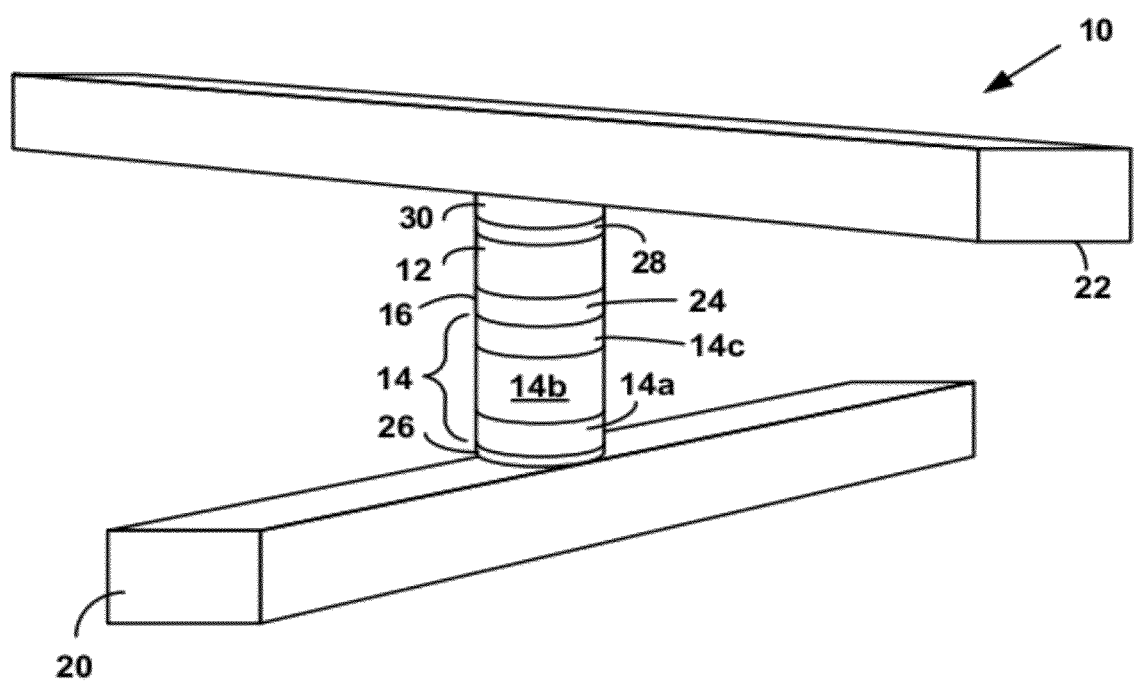
FIG. 2A is a simplified perspective view of an exemplary memory cell in accordance with this invention.

Referring now to FIG. 2A, an exemplary memory cell that includes a diode fabricated in accordance with this invention is described. Memory cell 10 includes a pillar 16 coupled between a first conductor 20 and a second conductor 22. Pillar 16 includes a memory element 12 coupled in series with a diode steering element 14 ("diode 14"). In some embodiments, a barrier layer 24 may be formed between memory element 12 and diode 14, a barrier layer 26 may be formed between diode 14 and first conductor 20, and a barrier layer 28 may be formed between memory element 12 and an optional metal layer 30.

Memory element 12 may be a resistivity-switching material, such as an antifuse dielectric, a fuse, a polysilicon memory effect material, a metal oxide or switchable complex metal oxide material, a carbon nanotube material, a carbon resistivity switching material (e.g., amorphous carbon containing nanocrystalline graphene, graphene, graphite, carbon nano-tubes, amorphous diamond-like carbon), a phase change material, a conductive bridge element, an electrolyte switching material, or a switchable polymer material.

For example, in some embodiments, memory element 12 may include graphitic carbon reversible resistivity switching materials formed by plasma-enhanced chemical vapor deposition ("PECVD"), such as described in U.S. patent application Ser. No. 12/499,467, filed Jul. 8, 2009, and titled "Carbon-Based Resistivity-Switching Materials And Methods Of Forming The Same," (the "'467 application"), which is incorporated by reference herein in its entirety for all purposes.

Barrier layer 24, memory element 12, and barrier layer 28 form a metal-insulator-metal ("MIM") structure, with barrier layer 24 and barrier layer 28 forming the bottom and top electrodes, respectively, of the MIM structure. Bottom electrode 24 and top electrode 28 may include titanium, titanium nitride, tantalum, tantalum nitride, tungsten, tungsten nitride, molybdenum, or other similar barrier layer. In some embodiments, top electrode 28 and optional metal layer 30 may be formed as part of second conductor 22.

Diode 14 can be a p-n diode, a p-i-n diode, a punch-through diode, a Schottky diode, a back-to-back punch-through diode, or a back-to-back Schottky diode. Diode 14 can be made of polysilicon, single crystal silicon, amorphous silicon or a combination thereof. Other semiconductor materials, such as Ge, SiGe, III-V materials, etc., also may be used.

For example, as shown in FIG. 2A, diode 14 may be a p-i-n diode that includes a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
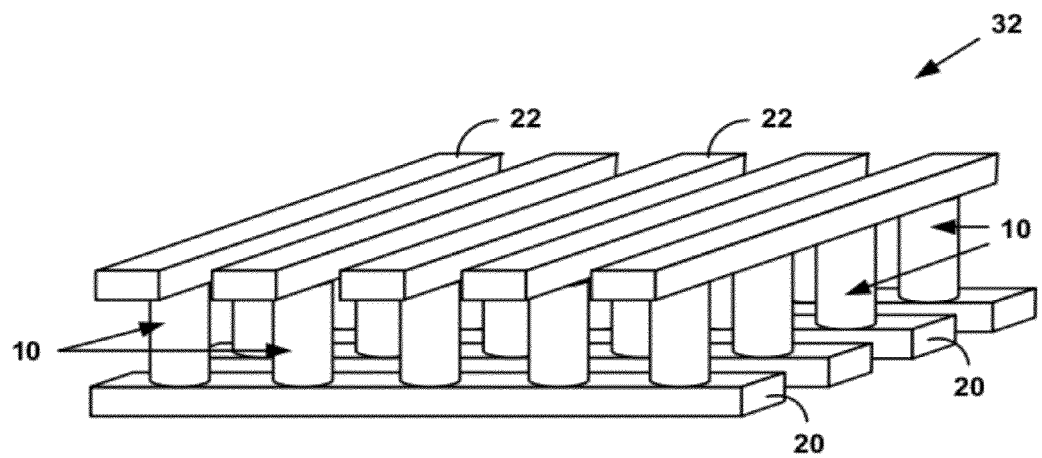
FIG. 2B is a simplified perspective view of a portion of a first exemplary memory level formed from a plurality of the memory cells of FIG. 2A.

FIG. 2B is a simplified perspective view of a portion of a first memory level 32 formed from a plurality of memory cells 10, such as memory cell 10 of FIG. 2A. For simplicity, memory element 12, diode 14, bottom electrode 24, barrier layer 26, top electrode 28, and metal layer 30 are not separately shown. Memory array 32 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
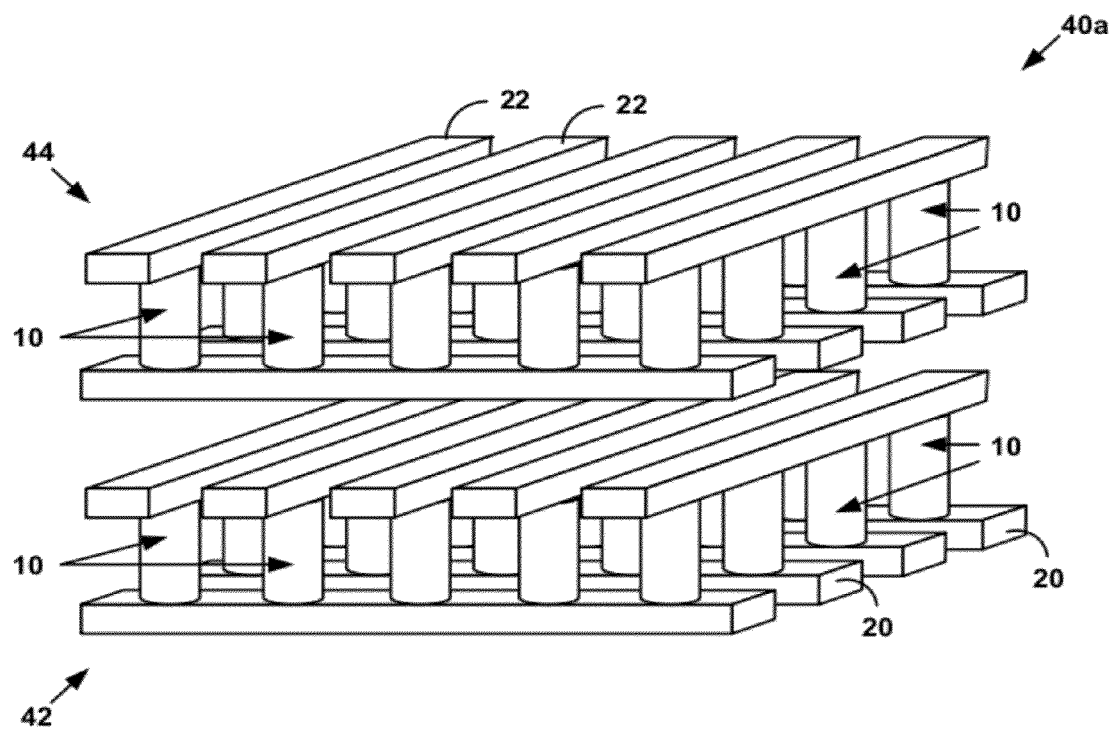
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
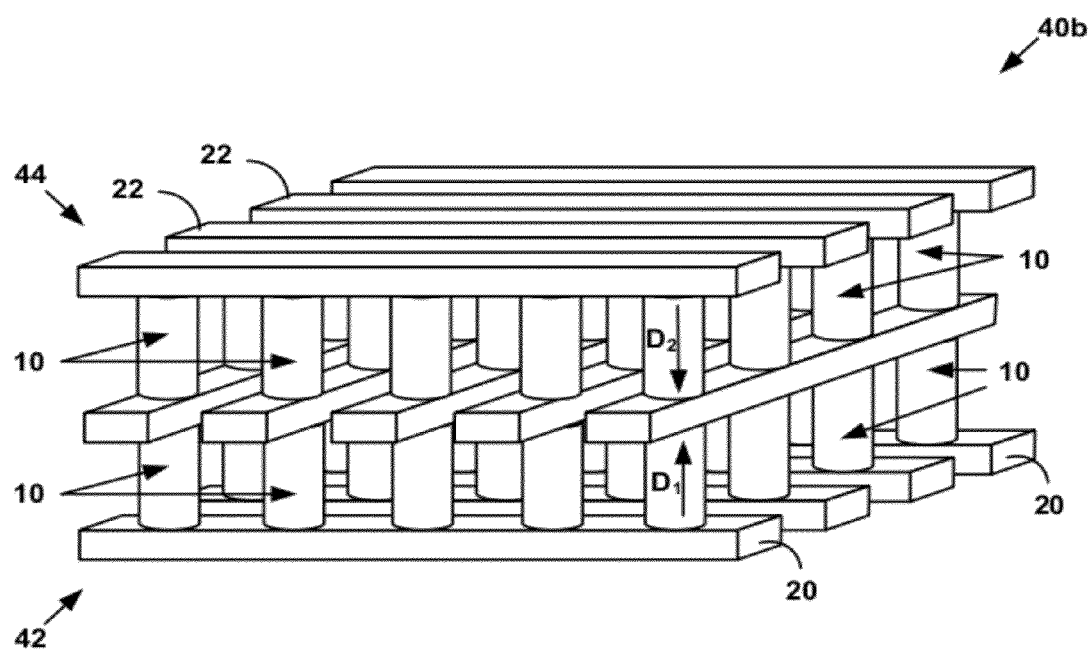
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell," which is incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. Pat. No. 7,767,499, titled "Large Array Of Upward Pointing P-I-N Diodes Having Large And Uniform Current," (the "'499 patent"), which is incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
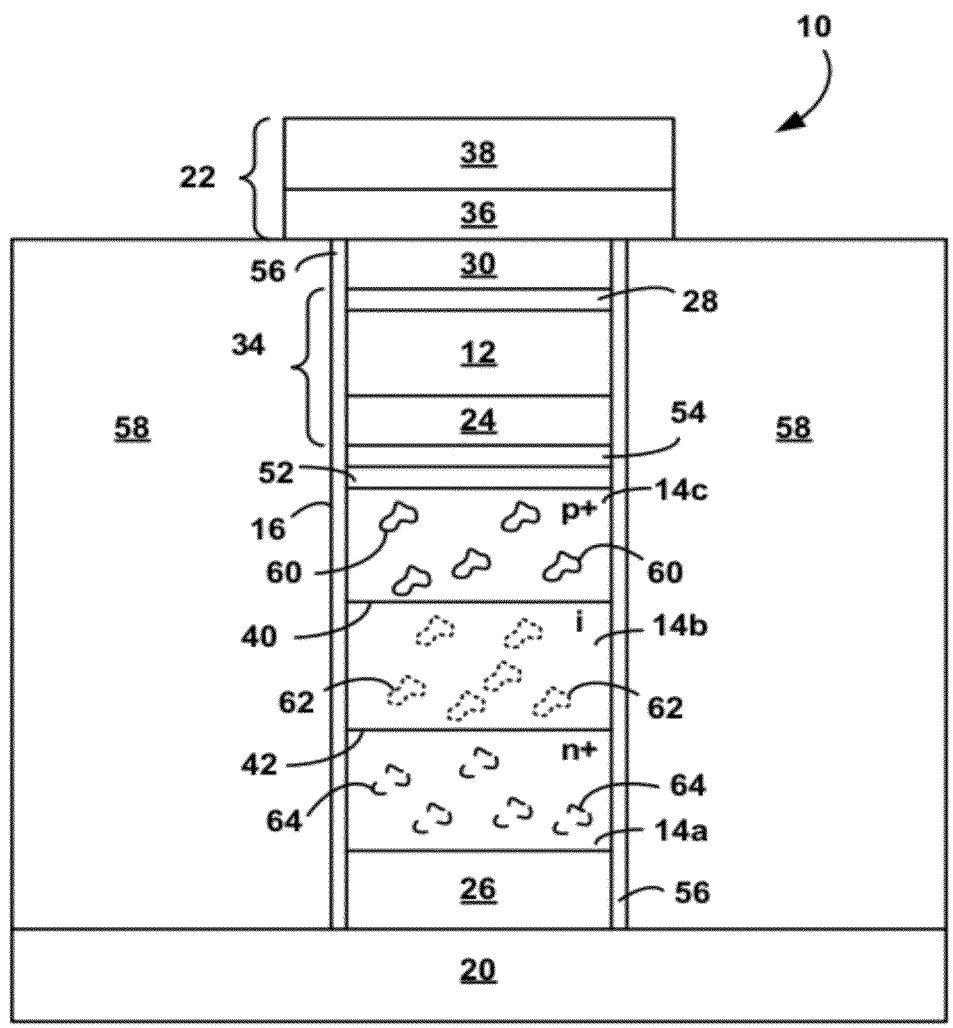
FIG. 3 illustrates a cross-sectional view of an exemplary memory cell in accordance with this invention.

FIG. 3 illustrates a cross-sectional view of an exemplary memory cell 10 of FIG. 2A formed on a substrate, such as a wafer (not shown). In particular, memory cell 10 includes a pillar 16 coupled between first and second conductors 20 and 22, respectively. Pillar 16 includes memory element 12 coupled in series with diode 14, and also may include bottom electrode 24, barrier layer 26, top electrode 28, a silicide layer 52, a silicide-forming metal layer 54, and a metal layer 30. Memory element 12, bottom electrode 24 and top electrode 28 form a MIM structure 34. A dielectric layer 58 substantially surrounds pillar 16. In some embodiments, a sidewall liner 56 separates selected layers of pillar 16 from dielectric layer 58. Adhesion layers, antireflective coating layers and/or the like (not shown) may be used with first and/or second conductors 20 and 22, respectively, to improve device performance and/or facilitate device fabrication.

First conductor 20 may include any suitable conductive material such as tungsten, any appropriate metal, heavily doped semiconductor material, a conductive silicide, a conductive silicide-germanide, a conductive germanide, or the like. Second conductor 22 includes a barrier layer 36, which may include titanium nitride or other similar barrier layer material, and conductive layer 38, which may include any suitable conductive material such as tungsten, any appropriate metal, heavily doped semiconductor material, a conductive silicide, a conductive silicide-germanide, a conductive germanide, or the like.

Diode 14 may be a vertical p-n or p-i-n diode (which may either point upward or downward), a punch-through diode, a Schottky diode, a back-to-back punch-through diode, or a back-to-back Schottky diode as previously described. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa). For convenience, in the embodiment of FIG. 3, diode 14 is a downward-pointing p-i-n diode.

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above n+ polysilicon region 14a, and a heavily doped p+ polysilicon region 14c above intrinsic region 14b. Persons of ordinary skill in the art will understand that the locations of the n+ and p+ regions may be reversed.

Diode 14 includes a first interface 40 between heavily doped p+ polysilicon region 14c and intrinsic polysilicon region 14b, and a second interface 42 between intrinsic region 14b and heavily doped n+ polysilicon region 14a. P+ polysilicon region 14c may include polysilicon grains 60, intrinsic region 14b may include polysilicon grains 62, and n+ polysilicon region 14a may include polysilicon grains 64. Grain boundaries (not shown) separate polysilicon grains 60-64 from one another, and also separate polysilicon grains 60-64 from amorphous material, such as amorphous silicon.

The '927 application describes, among other things, methods for in-situ passivation of traps along one or more interfaces, such as interfaces 40 and 42, using a passivating dopant (e.g., hydrogen) to reduce the number of traps within a diode, such as diode 14. In addition, the '927 application describes methods for in-situ passivation of traps along grain boundaries, such as grain boundaries of polysilicon grains 60-64, using a passivating dopant (e.g., hydrogen) to reduce the number of traps within the diode. Such in-situ passivation techniques may be used with memory cells in accordance with this invention, such as exemplary memory cell 10.

As described above, however, the techniques described in the '927 application do not eliminate all traps in the diode, and it is believed that residual traps along grain boundaries may contribute to high reverse leakage current and low forward current in the diode. Methods in accordance with this invention use counter doping compensation techniques to reduce the effects of traps along grain boundaries in diodes, such as diode 14.

Without wanting to be bound by any particular theory, it is believed that in polysilicon material, acceptor traps (which are located 0.35 eV below the conduction band) introduce an increased effective barrier height under forward bias that reduces forward current compared to diodes that do not include such traps. In addition, it is believed that under reverse bias, acceptor traps increase the electric field, and thus increase the reverse current compared to diodes that do not include such traps. It is further believed that the negative effects of acceptor traps are more pronounced if intrinsic region 14b is unintentionally n-type than unintentionally p-type.

Methods in accordance with this invention use counter doping compensation techniques to improve the performance of diodes, such as diode 14. In particular, exemplary methods in accordance with this invention counter dope diode 14 to compensate unintentionally n-type intrinsic region 14b to slightly p-type. It is believed that making intrinsic region slightly p-type makes diode 14 less susceptible to acceptor traps.

In particular, it is believed that such counter doping techniques decrease the effective barrier height of diode 14 under forward bias, and decrease the equivalent electric field of diode 14 under reverse bias. As a result, it is believed that exemplary counter doping compensation methods in accordance with this invention improve the performance (e.g., increase the forward current and/or reduce the reverse leakage current) of diodes, such as diode 14.

As described in more detail below, in one exemplary method, ion implantation techniques are used to create a counter doping profile to compensate unintentionally n-type intrinsic region 14b to slightly p-type intrinsic region 14b. As also described in more detail below, in an alternative exemplary method in accordance with this invention, in-situ doping techniques are used to create a counter doping profile to compensate unintentionally n-type intrinsic region 14b to slightly p-type intrinsic region 14b.

After performing the exemplary counter doping techniques of this invention, the methods described in the '927 application for atmospheric passivation of traps along interfaces 40 and 42, and/or along grain boundaries of polysilicon grains 60-64, using a passivating dopant (e.g., hydrogen, fluorine, etc.) may be performed to reduce the number of traps within diode 14. In particular, the combination of passivation (to reduce the trap density) and counter doping (to reduce the trap effect) can further improve the device performance.

As described in the '927 application, passivation preferably is performed at a temperature of between about 400° C. and about 500° C., which is below the activation temperature of the dopants used in the counter doping technique. Accordingly, passivation may occur before or after counter doping. However, if passivation is performed at or above about 600°

C., the passivation step preferably should be performed before performing counter doping to prevent dopant diffusion.

Referring again to FIG. 3, if diode 14 is fabricated from deposited silicon (e.g., amorphous or polycrystalline), a silicide layer 52 may be formed on diode 14 to place the deposited silicon in a low resistivity state, as fabricated. Such a low resistivity state allows for easier programming of memory cell 10, as a large voltage is not required to switch the deposited silicon to a low resistivity state. For example, a silicide-forming metal layer 54 such as titanium or cobalt may be deposited on p+ polysilicon region 14c. In some embodiments, an additional nitride layer (not shown) may be formed at a top surface of silicide-forming metal layer 54. In particular, for highly reactive metals, such as titanium, an additional cap layer such as TiN layer may be formed on silicide-forming metal layer 54. Thus, in such embodiments, a Ti/TiN stack is formed on top of p+ polysilicon region 14c.

A rapid thermal anneal ("RTA") step may then be performed to form silicide regions by reaction of silicide-forming metal layer 54 with p+ region 14c. The RTA step may be performed at a temperature between about 650° C. and about 750° C., more generally between about 600° C. and about 800° C., preferably at about 750° C., for a duration between about 10 seconds and about 60 seconds, more generally between about 10 seconds and about 90 seconds, preferably about 1 minute, and causes silicide-forming metal layer 54 and the deposited silicon of diode 14 to interact to form silicide layer 52, consuming all or a portion of the silicide-forming metal layer 54.

As described in U.S. Pat. No. 7,176,064, titled "Memory Cell Comprising A Semiconductor Junction Diode Crystallized Adjacent To A Silicide," which is incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 52 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 54, following the RTA step, the nitride layer may be stripped using a wet chemistry. For example, if silicide-forming metal layer 54 includes a TiN top layer, a wet chemistry (e.g., $H_2O:H_2O_2:NH_4OH$ in a 10:2:1 ratio at a temperature of between about 40-60° C.) may be used to strip any residual TiN.

Exemplary Fabrication Processes for Memory Cells

Referring now to FIGS. 4A-4K, a first exemplary method of forming an exemplary memory level in accordance with this invention is described. In particular, FIGS. 4A-4K illustrate an exemplary ion implantation counter doping compensation method of forming an exemplary memory level including memory cells 10, such as illustrated in FIG. 3. As will be described below, the first memory level includes a plurality of memory cells that each include a steering element and a memory element coupled to the steering element. Additional memory levels may be fabricated above the first memory level (as described previously with reference to FIGS. 2C-2D).

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 and about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 106 may comprise about 200 and about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 and about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
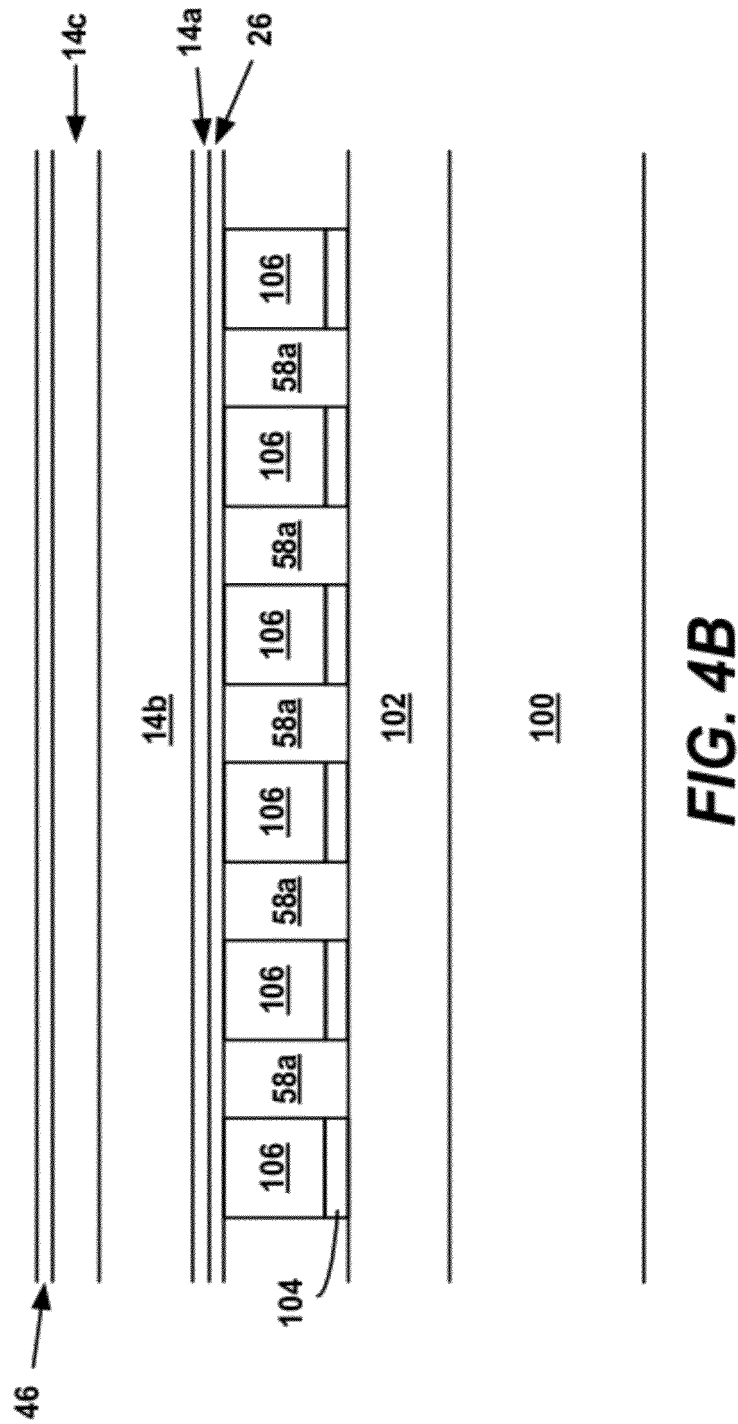

Following planarization, the diode structures of each memory cell are formed. With reference to FIG. 4B, a barrier layer 26 is formed over planarized top surface 110 of substrate 100. Barrier layer 26 may be about 20 and about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 26, deposition of the semiconductor material used to form the diode of each memory cell begins (e.g., diode 14 in FIGS. 1 and 3). Each diode may be a vertical p-n diode, a p-i-n diode, a punch-through diode, a Schottky diode, a back-to-back punch-through diode, or a back-to-back Schottky diode as previously described. In some embodiments, each diode is formed from a polycrystalline semiconductor material such as polysilicon, a polycrystalline silicon-germanium alloy, polygermanium or any other suitable material. For convenience, formation of a polysilicon, p-i-n, downward-pointing diode is described herein. It will be understood that other materials and/or diode configurations may be used.

With reference to FIG. 4B, following formation of barrier layer 26, a heavily doped n+ silicon layer 14a is deposited on barrier layer 26. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 20 and about 1000 angstroms, preferably about 100 angstroms, of phosphorus or arsenic doped silicon having a doping concentration of about $10^{21}$ atoms/cm$^3$. Other layer thicknesses, doping types and/or doping concentrations may be used. N+ silicon layer 14a may be doped in-situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. As previously mentioned, as a result of defects and/or contaminants, intrinsic silicon layer 14b behaves as though it is slightly n-type. In at least one embodiment, intrinsic silicon layer 14b may be about 50 and about 4800 angstroms, preferably about 300 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b. Use of such a layer is described, for example, in U.S. Pat. No. 7,405,465, filed Dec. 9, 2005, and titled "Deposited Semiconductor Structure To Minimize N-Type Dopant Diffusion And Method Of Making," which is incorporated by reference herein in its entirety for all purposes. In some embodiments, a few hundred angstroms or less of silicon-germanium alloy with about 10 atomic percent ("at %") or more of germanium may be employed.

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include BF$_2$, BF$_3$, B and the like. In some embodiments, an implant dose of about 1-5× $10^{15}$ ions/cm$^2$ may be employed. Other implant species and/or doses may be used. Further, in some embodiments, a diffusion process may be employed. In at least one embodiment, the resultant p+ silicon layer 14c has a thickness of about 20-1000 angstroms, preferably about 100 angstroms, although other p+ silicon layer sizes may be used. As previously mentioned, persons of ordinary skill in the art will understand that the locations of the n+ and p+ regions may be reversed.

Following formation of p+ silicon layer 14c, an optional pad layer 46 is deposited over p+ silicon layer 14c. Pad layer 46 may be used to prevent damage to p+ silicon layer 14c from a subsequent ion implantation step. Exemplary pad layer materials include oxides (e.g., SiO$_2$), nitrides (e.g., SiN), or other similar materials, and may be formed by thermal oxidation, CVD deposition, thermal nitridation, or other similar techniques. In some embodiments, pad layer 46 has a thickness of between about 5 nm and about 50 nm, preferably about 10 nm. Other pad layer materials and/or thicknesses may be used.

With reference to FIG. 4C, following formation of pad layer 46, silicon layers 14a, 14b and 14c are implanted with dopants 48. In particular, silicon layers 14a, 14b and 14c are implanted with dopants 48 to create a counter doping profile to compensate unintentionally n-type intrinsic region 14b to slightly p-type intrinsic region 14b. Final locations of dopants 48 can be controlled by varying process parameters such as beam angle, beam energy, exposure time, anneal temperature, anneal time, pad layer thickness, and other similar parameters.

Exemplary species that may be implanted to compensate intrinsic region 14b are boron, boron difluoride, indium, B$_2$H$_6$, Al, combinations thereof, and the like. Exemplary acceleration voltages range from about 0.5-50 KeV. Exemplary doses range from about $1\times10^{10}$-$4\times10^{14}$ atoms/cm$^2$. Implant angles may range from about 2-82 degrees. Other implant species, acceleration voltages, doses and/or implant angles may be used.

Figure 5:
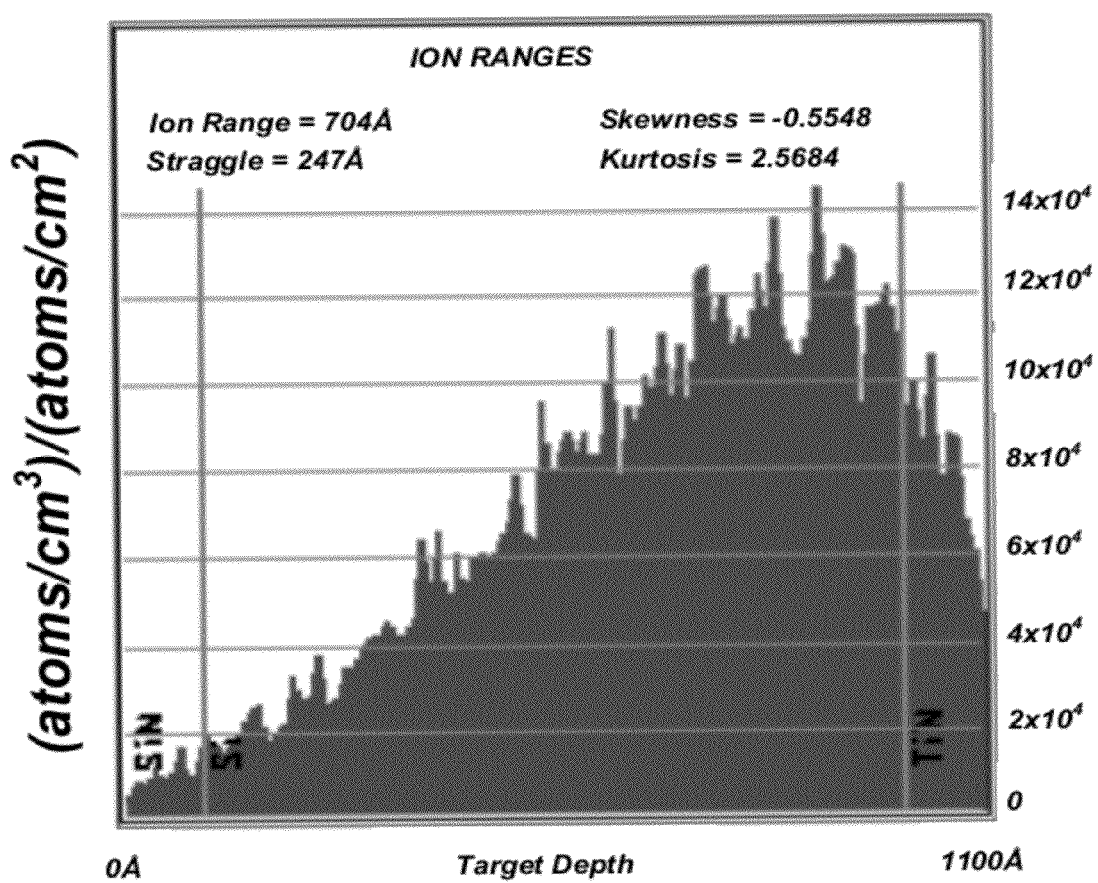
FIG. 5 is an exemplary counter doping profile in accordance with this invention.

The implantation parameters may be adjusted to achieve any desired ion implantation profile. Preferably, the peak of the implanted dopants 48 is in the junction area 50 near p+ silicon layer 14c. An exemplary ion implantation profile is depicted in FIG. 5. The graph illustrates the doping concentration for an exemplary dopant (e.g., boron) versus the depth from the top of pad layer 46 (in the illustrated example, pad layer 46 is silicon nitride) prior to performing an anneal.

Referring again to FIG. 4C, following counter doping implantation, pad layer 46 is removed, such as by a buffered oxide etch, or other similar process, and substrate 100 may be cleaned, such as using a wet chemistry, sputter pre-clean, or other similar step. For example, a buffered oxide etch (e.g., NH$_4$F/HF at room temperature for about 4-6 seconds) may be used.

Figure 4D:
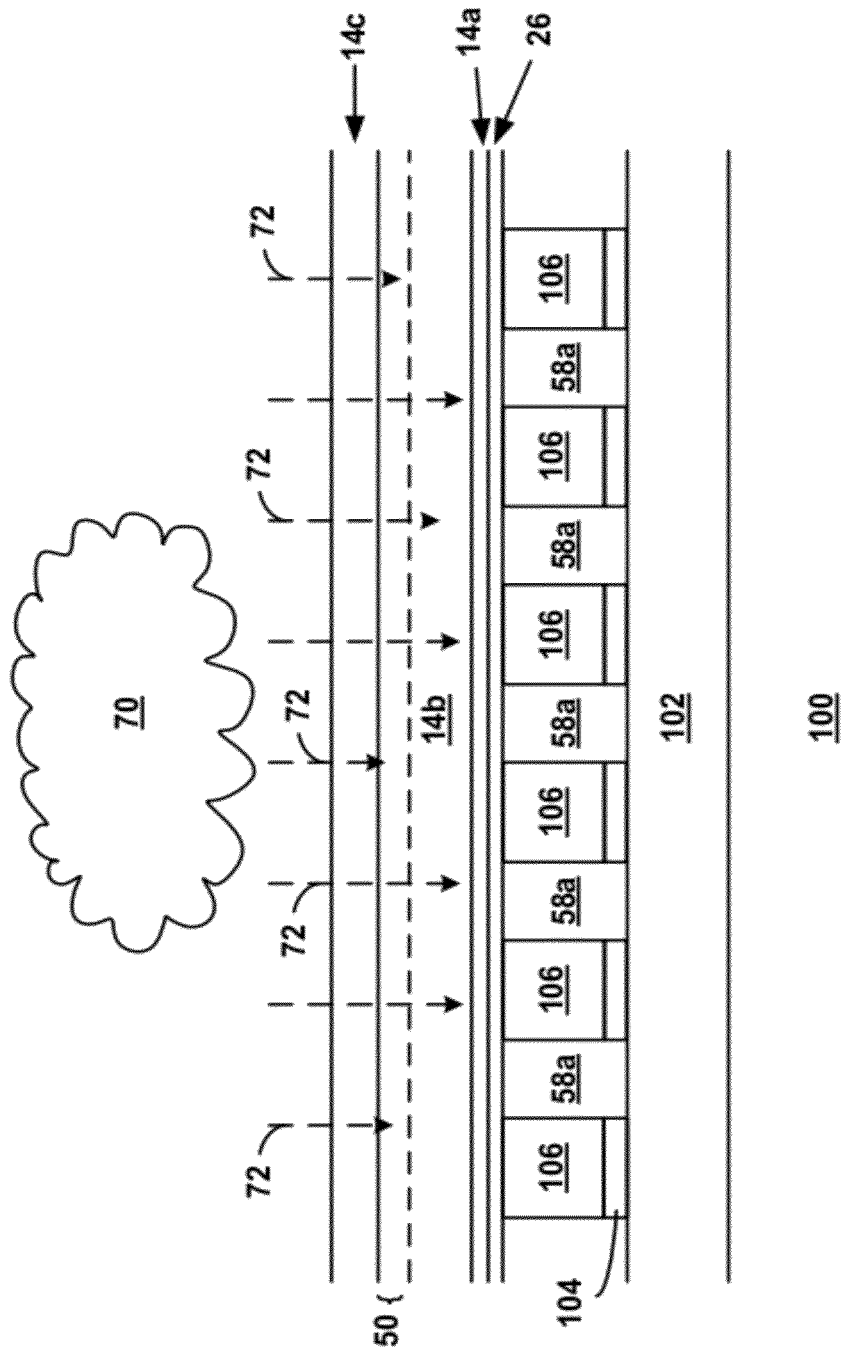

Next, an anneal may be performed to passivate traps along interfaces and/or along grain boundaries of diode 14. For example, as shown in FIG. 4D, in-situ passivation methods, such as the exemplary methods described in the '927 application, may be used to passivate traps along interfaces and/or along grain boundaries of polysilicon grains in diode 14, using a passivating dopant (e.g., hydrogen) to reduce the number of traps within diode 14.

In one exemplary in-situ passivation technique, a top surface of p+ silicon layer 14c is exposed to an atmosphere 70 at an elevated temperature. Atmosphere 70 contains passivation elements that will dope diode 14. For example, atmosphere 70 can include a forming gas of between about 5% and about 50% hydrogen gas and between about 50% and about 95% nitrogen gas at a temperature between about 450° C. and about 550° C., more generally between about 350° C. and about 650° C. Other forming gasses, ratios and temperatures may be used. Alternatively, atmosphere 70 may be a hydrogen plasma.

Before passivation, diode 14 is preferably in an amorphous state. During passivation, the passivation elements (e.g., hydrogen) in atmosphere 70 diffuse into diode 14, as illustrated by arrows 72. The final location of dopants can be controlled by varying process parameters such as dopant concentration in atmosphere 70, process temperature, exposure time, anneal parameters, and other similar process parameters. For example, a concentration of hydrogen dopants may peak at about an interface and/or region in diode 14. Other similar passivation techniques may be used.

Figure 4E:
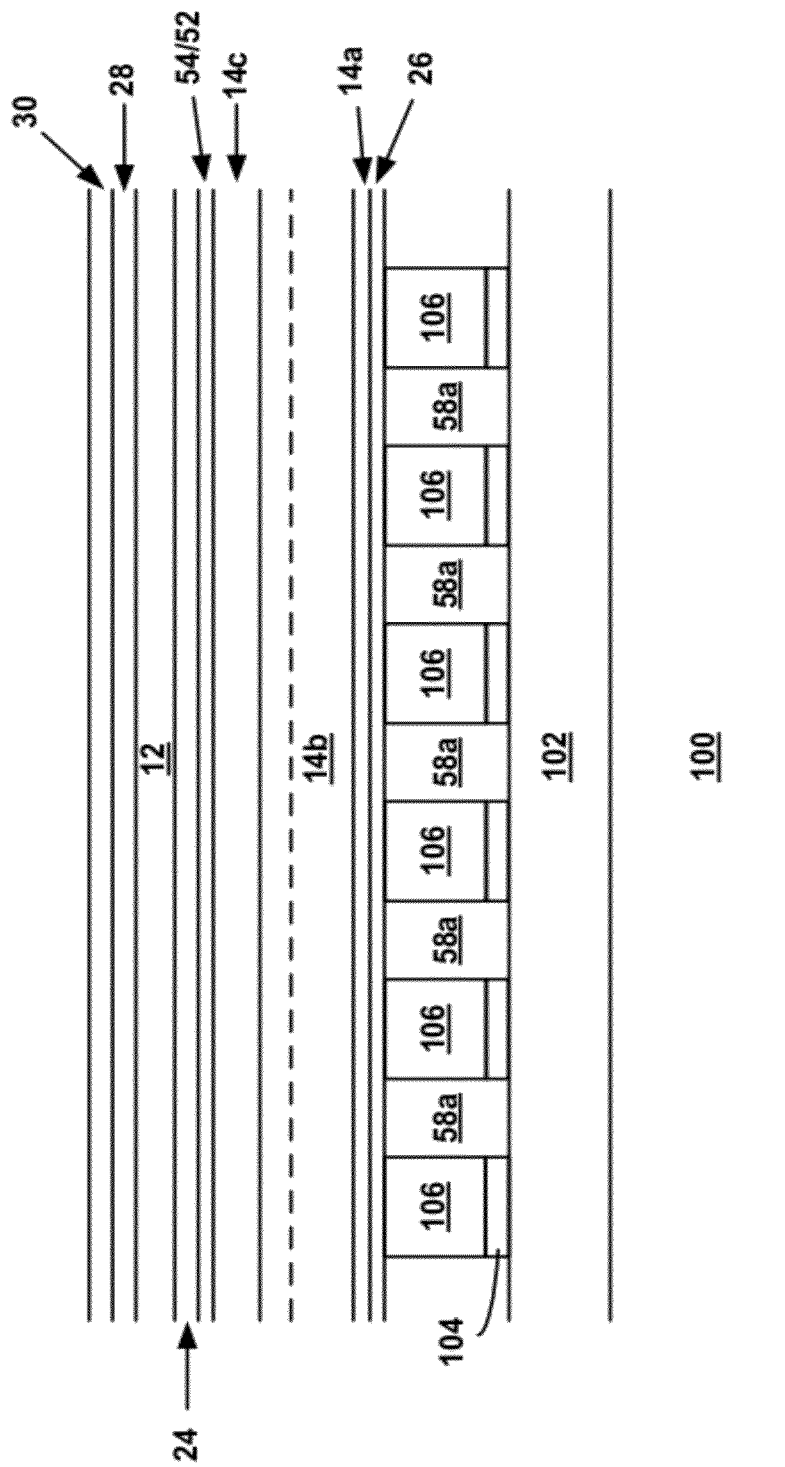

Referring now to FIG. 4E, a silicide-forming metal layer 54 is deposited over p+ silicon layer 14c. Exemplary silicide-forming metals include sputter or otherwise deposited Ti or cobalt. In some embodiments, silicide-forming metal layer 54 has a thickness of about 10 and about 200 angstroms, preferably about 20 and about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 54, an RTA step may be performed to form silicide layer 52, consuming all or a portion of the silicide-forming metal layer 54. The RTA step may be performed at a temperature between about 650° C. and about 750° C., more generally between about 600° C. and about 800° C., preferably at about 750° C., for a duration between about 10 seconds and about 60 seconds, more generally between about 10 seconds and about 90 seconds, preferably about 60 seconds. Following the RTA step, any residual nitride layer from silicide-forming metal layer 54 may be stripped using a wet chemistry, as described above, and as is known in the art.

Following the RTA step and the nitride strip step, a bottom electrode 24 is deposited. For example, bottom electrode 24 may be between about 25-100 angstroms, more generally between about 25-200 angstroms, of titanium, titanium nitride, tantalum, tantalum nitride, tungsten, tungsten nitride, molybdenum, or other similar barrier layer material.

Next, memory element 12 is deposited over bottom electrode 24. Memory element 12 may be a resistivity-switching material, such as an antifuse dielectric, a fuse, a polysilicon memory effect material, a metal oxide or switchable complex metal oxide material, a carbon nanotube material, a carbon resistivity switching material (e.g., amorphous carbon containing nanocrystalline graphene, graphene, graphite, carbon nano-tubes, amorphous diamond-like carbon), a phase change material, a conductive bridge element, an electrolyte switching material, or a switchable polymer material.

For example, memory element 12 may be a carbon layer 12 formed by a PECVD method, such as described in the '467 application. Memory element 12 may be formed having a thickness between about 10 and about 600 angstroms, more generally between about 1 and about 5000 angstroms. Other thicknesses may be used.

Next, top electrode 28 is formed above memory element 12. Top electrode 28 may be titanium, titanium nitride, tantalum, tantalum nitride, tungsten, tungsten nitride, molybdenum, or another suitable barrier layer, combinations of one or more barrier layers, barrier layers in combination with other layers such as Ti/TiN, Ta/TaN, W/WN stacks, or the like. Other barrier layer materials may be employed. Top electrode 28 may be formed by atomic layer deposition ("ALD"), such as described in U.S. patent application Ser. No. 12/536,457, filed Aug. 5, 2009, titled "Memory Cell That Includes A Carbon-Based Memory Element And Methods Of Forming The Same," (the "'457 Application"), which is incorporated by reference herein in its entirety for all purposes. In other embodiments, top electrode 28 may be formed using a CVD technique, or other similar deposition technique.

Next, a metal layer 30 may be deposited over top electrode 28. The resulting structure is shown in FIG. 4E. For example, between about 800 and about 1200 angstroms, more generally between about 500 angstroms and about 1500 angstroms, of tungsten may be deposited on top electrode 28. Other materials and thicknesses may be used. Any suitable method may be used to form metal layer 30. For example, CVD, PVD, or the like may be employed. As described in more detail below, metal layer 30 may be used as a hard mask layer, and also may be used as a stop during a subsequent chemical mechanical planarization ("CMP") step. A hard mask is an etched layer which serves to pattern the etch of an underlying layer.

Figure 4F:
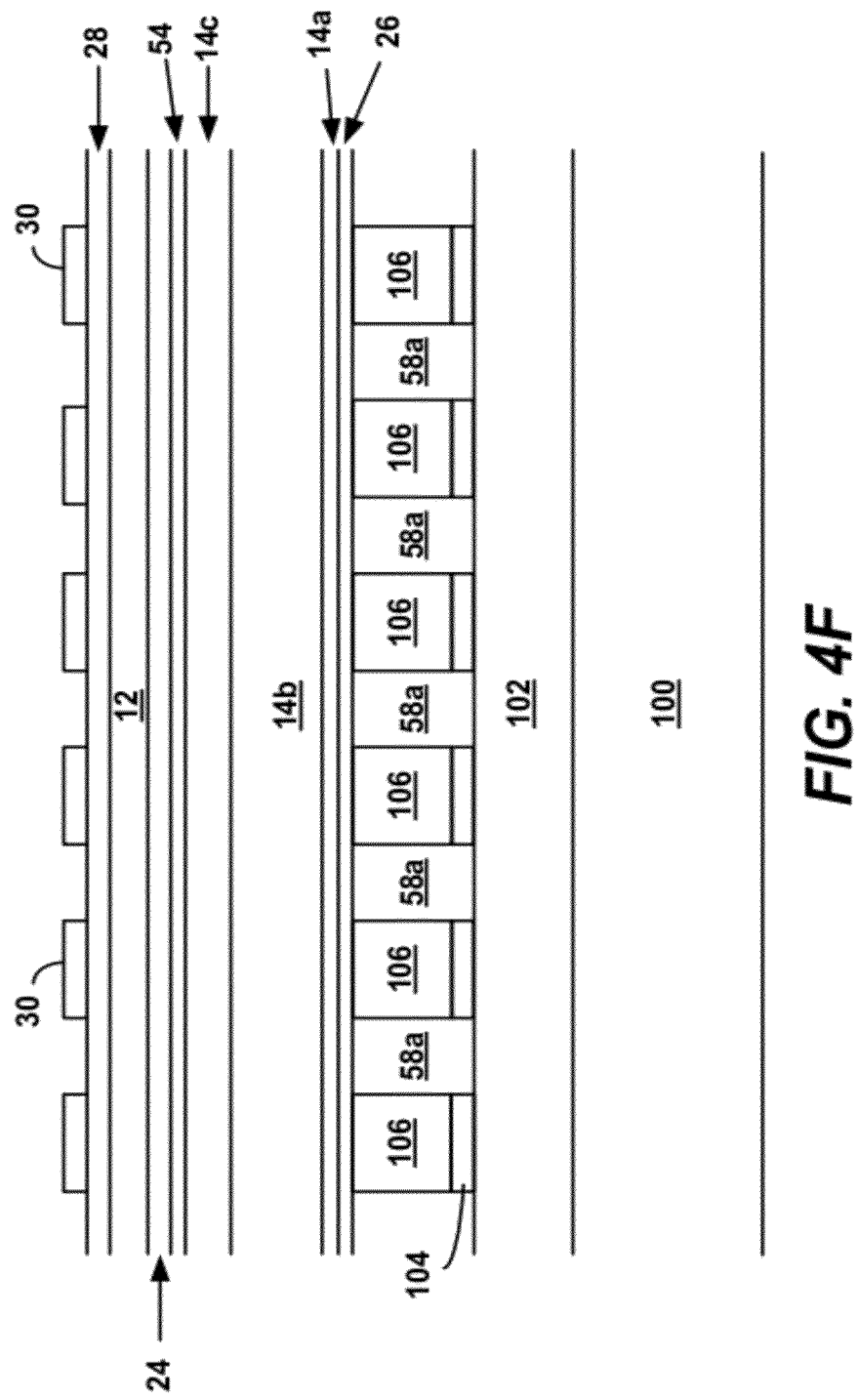

As shown in FIG. 4F, metal layer 30 is patterned and etched to form patterned metal hardmask regions 30. Patterned metal hardmask regions 30 may have about the same pitch and about the same width as conductors 20 below, such that each patterned metal hardmask regions 30 is formed on top of a conductor 20. Some misalignment may be tolerated. Persons of ordinary skill in the art will understand that patterned metal hardmask regions 30 may have a smaller width than conductors 20.

For example, photoresist ("PR") may be deposited on metal layer 30, patterned using standard photolithography techniques, and then the photoresist may be removed. Alternatively, a hard mask of some other material, for example silicon dioxide, may be formed on top of metal layer 30, with bottom antireflective coating ("BARC") on top, then patterned and etched. Similarly, dielectric antireflective coating ("DARC") may be used as a hard mask.

Figure 4G:
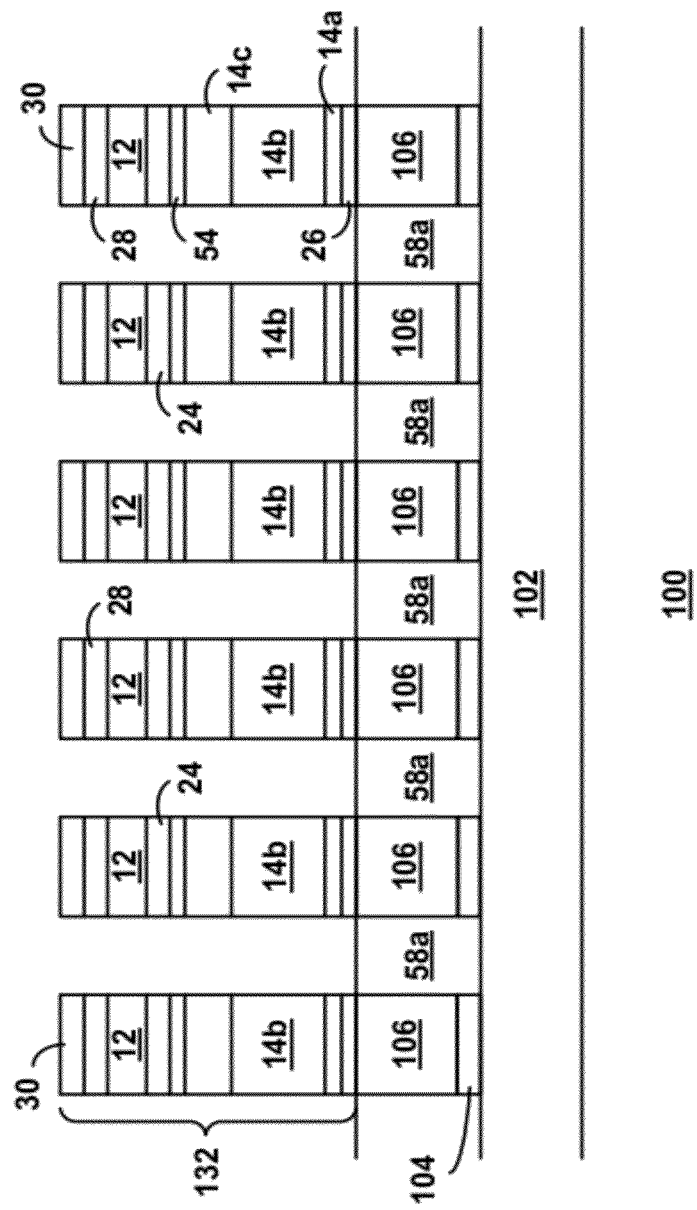

As shown in FIG. 4G, metal hardmask regions 30 are used to pattern and etch top electrode 28, memory element 12, bottom electrode 24, silicide-forming metal layer 54, diode layers 14a-14c and barrier layer 26 to form pillars 132. Pillars 132 may have about the same pitch and about the same width as conductors 20 below, such that each pillar 132 is formed on top of a conductor 20. Some misalignment may be tolerated. Persons of ordinary skill in the art will understand that pillars 132 may have a smaller width than conductors 20.

Any suitable etch chemistries, and any suitable etch parameters, flow rates, chamber pressures, power levels, process temperatures, and/or etch rates may be used. In some embodiments, top electrode 28, memory element 12, bottom electrode 24, silicide-forming metal layer 54, diode layers 14a-14c and barrier layer 26 may be patterned using a single etch step. In other embodiments, separate etch steps may be used. The etch proceeds down to dielectric layer 58a.

In some exemplary embodiments, the memory cell layers may be etched using chemistries selected to minimize or avoid damage to carbon material. For example, $O_2$, CO, $N_2$, or $H_2$, or other similar chemistries may be used. In embodiments in which CNT material is used in the memory cells, oxygen ("$O_2$"), boron trichloride ("$BCl_3$") and/or chlorine ("$Cl_2$") chemistries, or other similar chemistries, may be used. Any suitable etch parameters, flow rates, chamber pressures, power levels, process temperatures, and/or etch rates may be used. Exemplary methods for etching carbon material are described, for example, in U.S. patent application Ser. No. 12/415,964, "Electronic Devices Including Carbon-Based Films Having Sidewall Liners, and Methods of Forming Such Devices," filed Mar. 31, 2009, which is incorporated by reference in its entirety for all purposes.

After the memory cell layers have been etched, pillars 132 may be cleaned. In some embodiments, a dilute hydrofluoric/sulfuric acid clean is performed. Post-etch cleaning may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for about 60 seconds. Megasonics may or may not be used. Alternatively, $H_2SO_4$ may be used.

Figure 4H:
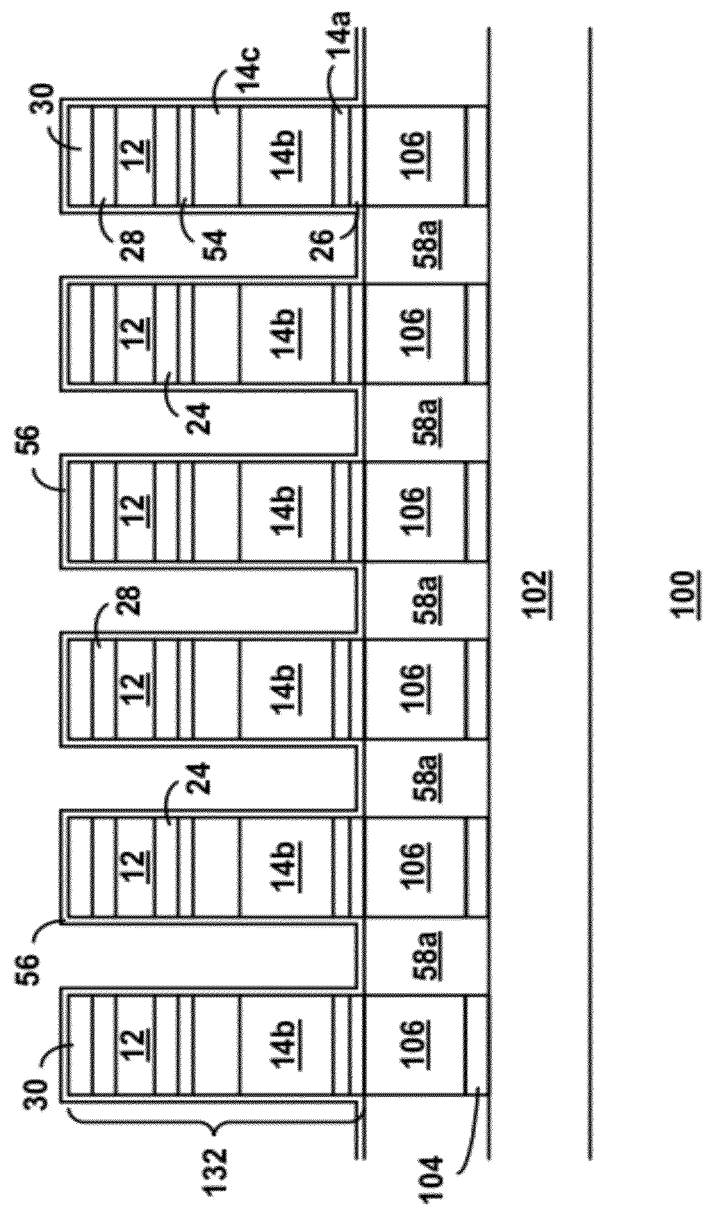

As illustrated in FIG. 4H, a conformal dielectric liner 56 is deposited above and around pillars 132. In an exemplary embodiment of this invention, dielectric liner 56 may be formed from SiN or BN. Alternatively, dielectric sidewall liner 54 may be formed from other materials, such as SiN, $Si_xC_yN_z$ and $Si_xO_yN_z$ (with low O content), where x, y and z are non-zero numbers resulting in stable compounds. Dielectric liner 56 may be formed by ALD, PECVD, or other similar process. In some embodiments of this invention, dielectric liner 56 is SiN formed by ALD and has a thickness of between about 100 angstroms and about 250 angstroms, more generally between about 100 angstroms and about 300 angstroms. Other thicknesses may be used.

Figure 4I:
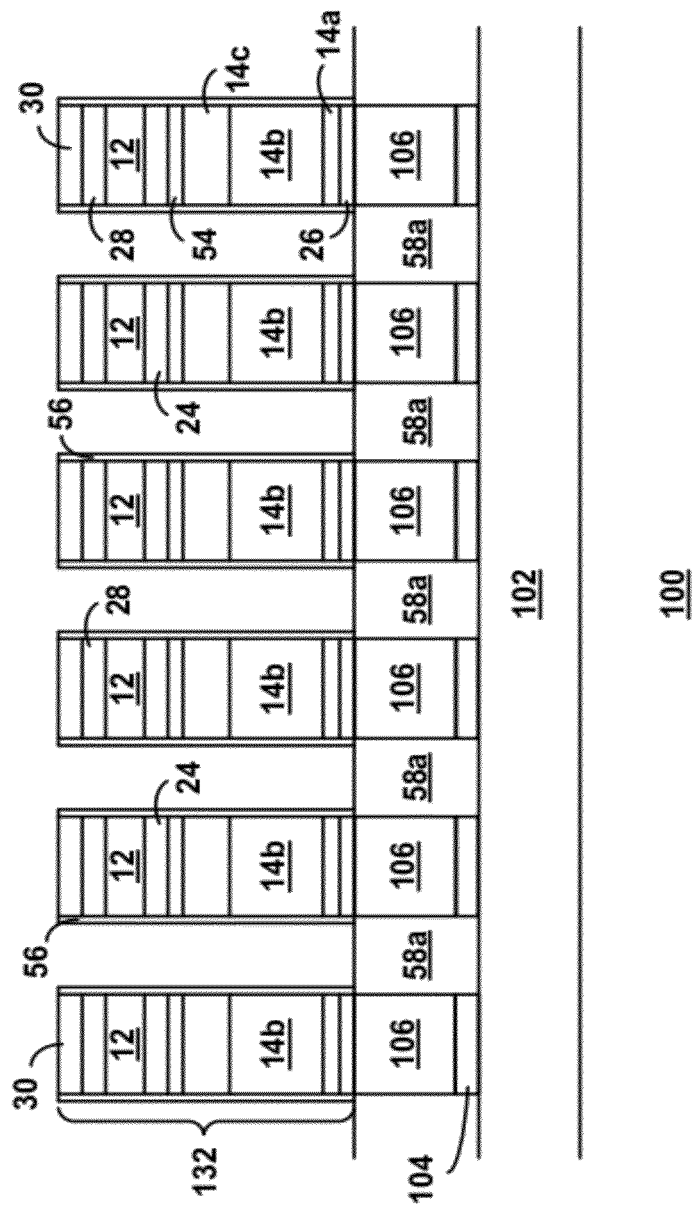
Figure 4J:
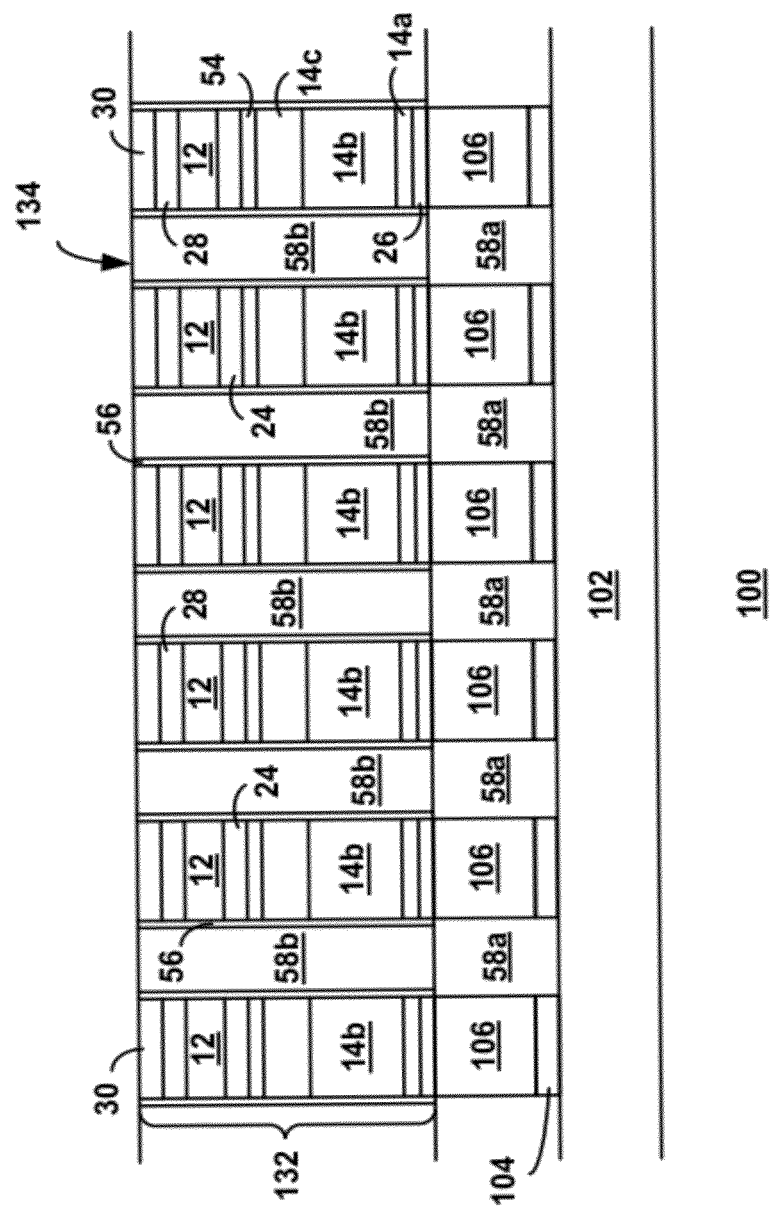

With reference to FIG. 4I, an anisotropic etch is used to remove lateral portions of dielectric liner 56, leaving only sidewall portions of dielectric liner 56 on the sides of pillars 132. For example, a sputter etch or other suitable process may be used to anisotropically etch liner 56. Sidewall dielectric liner 56 may protect the memory element 12 from damage during deposition of dielectric layer 58b (not shown in FIG. 4I), described below.

Next, a dielectric layer 58b is deposited over pillars 132 to gapfill between pillars 132. For example, approximately 2000-7000 angstroms of silicon dioxide may be deposited and planarized using CMP or an etchback process to remove excess dielectric layer material 58b to form a planar surface 134, resulting in the structure illustrated in FIG. 4J. During the planarization process, metal layer 30 may be used as a CMP stop. Planar surface 134 includes exposed top surfaces of pillars 132 separated by dielectric material 58b (as shown). Other dielectric materials may be used for the dielectric layer 58b such as silicon nitride, silicon oxynitride, low K dielectrics, etc., and/or other dielectric layer thicknesses may be used. Exemplary low K dielectrics include carbon doped oxides, silicon carbon layers, or the like.

Figure 4K:
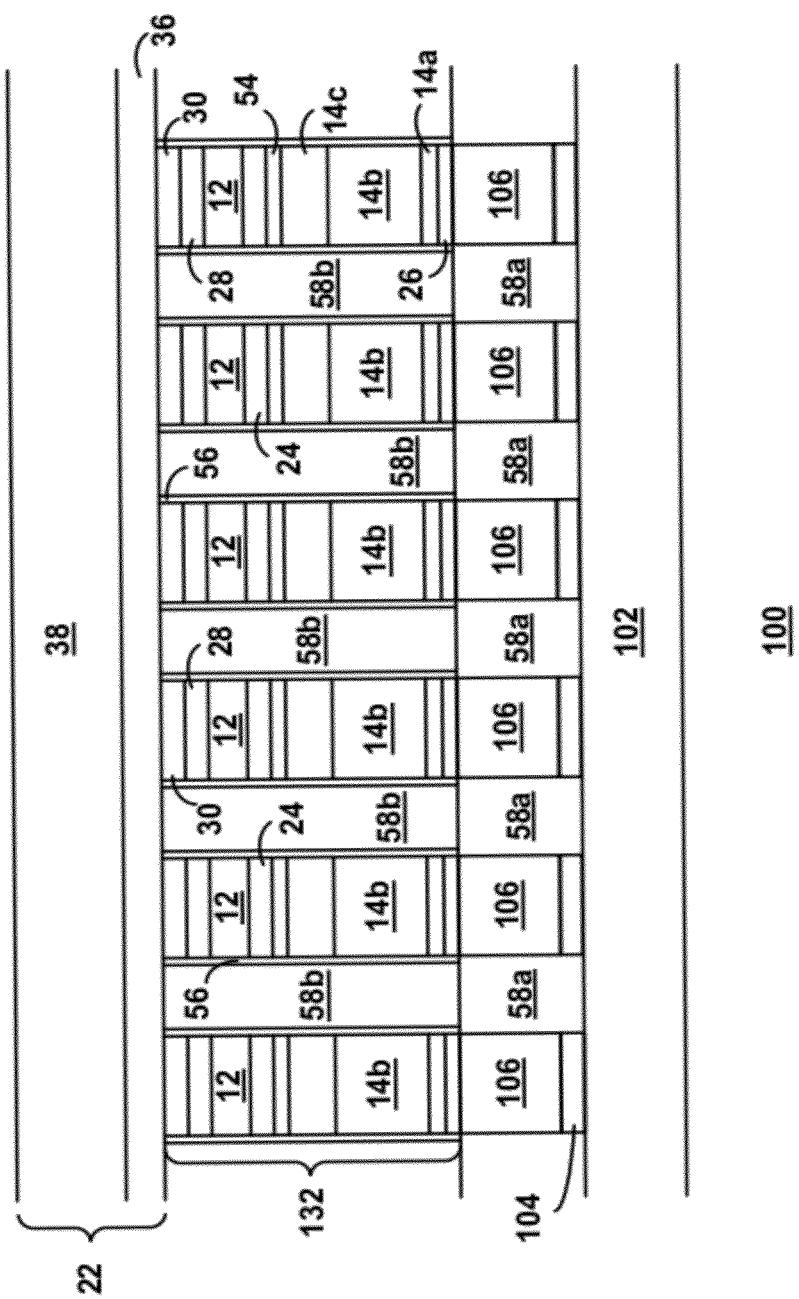

With reference to FIG. 4K, second conductors 22 may be formed above pillars 132 in a manner similar to the formation of first conductors 20. For example, in some embodiments, one or more barrier layers and/or adhesion layers 36 may be deposited over pillars 132 prior to deposition of a conductive layer 38 used to form second conductors 22.

Conductive layer 38 may be formed from any suitable conductive material such as tungsten, another suitable metal, heavily doped semiconductor material, a conductive silicide, a conductive silicide-germanide, a conductive germanide, or the like deposited by PVD or any other any suitable method (e.g., CVD, etc.). Other conductive layer materials may be used. Barrier layers and/or adhesion layers 36 may include titanium, titanium nitride, tantalum, tantalum nitride, tungsten, tungsten nitride, molybdenum, combinations of one or more layers, or any other suitable material(s). The deposited conductive layer 38 and barrier and/or adhesion layer 36 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 36 and conductive layer 38 (and/or a conductive seed, conductive fill and/or barrier layer if needed). Adhesion layer 36 and conductive layer 38 then may be planarized to form a planar surface.

Following formation of second conductors 22, the resultant structure may be annealed to crystallize the deposited semiconductor material of diodes 14 (and/or to form silicide regions by reaction of the silicide-forming metal layer 54 with n+ region 14c). The lattice spacing of titanium silicide and cobalt silicide are close to that of silicon, and it appears that silicide layers 52 may serve as "crystallization templates" or "seeds" for adjacent deposited silicon as the deposited silicon crystallizes (e.g., silicide layer 52 enhances the crystalline structure of silicon diode 14 during annealing at temps of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds and about 2 minutes in nitrogen at a temperature of about 600 to 800° C., and more preferably between about 650 to 750° C. Other annealing times, temperatures and/or environments may be used.

The foregoing description discloses only exemplary embodiments of the invention. Modifications of the above disclosed methods and devices which fall within the scope of the invention will be readily apparent to those of ordinary skill in the art.

For example, persons of ordinary skill in the art will understand that as an alternative to the exemplary ion implantation technique described above, in-situ counter doping concentration techniques may be used to compensate unintentionally n-type intrinsic region 14b to slightly p-type. For instance, by flowing a donor gas (a gas including boron, boron difluoride, indium, $B_2H_6$, aluminum, or other similar donor) during deposition of intrinsic region 14b, a desired doping profile can be achieved.

For example, if intrinsic region 14b has a background n-type doping concentration between about $1-5 \times 10^{17}$ atoms/$cm^3$, it is possible to perform in-situ counter doping using, e.g., boron, to reduce the background concentration to about $5 \times 10^{15}$ atoms/$cm^3$. Such in-situ counter doping techniques may be used to provide well-controlled doping profiles (e.g., uniform doping profiles), and also avoid ion damage from ion implantation techniques.

Persons of ordinary skill in the art also will understand that counter doping techniques in accordance with this invention are not limited to compensating only the intrinsic region of a p-i-n diode. Such techniques, for example, may be extended to the junction area of p-n diodes or the semiconductor-metal contact area in Schottky diodes.

In addition, persons of ordinary skill in the art will understand that counter doping techniques in accordance with this invention are not limited to compensating n-type semiconductor to p-type semiconductor. For example, the exemplary ion implantation and in-situ techniques described above may be used with n-type dopants to reduce the p-doping profile of p-type semiconductor material.

Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising:
    forming a diode including a first region having a first conductivity type;
    counter-doping the diode to change the first region to a second conductivity type; and
    forming a memory element coupled in series with the diode,
    wherein the first region includes unintentionally doped semiconductor material.

2. The method of claim 1, wherein the diode comprises a vertical polysilicon diode.

3. The method of claim 1, wherein the memory element comprises a metal-insulator-metal ("MIM") stack.

4. The method of claim 3, wherein the MIM stack comprises a reversible resistance-switching element.

5. The method of claim 1, wherein the memory element comprises one or more of amorphous carbon containing nanocrystalline graphene, graphene, graphite, carbon nanotubes, amorphous diamond-like carbon, metal oxides, solid electrolyte, and phase change memory.

6. The method of claim 1, wherein counter-doping comprises implanting a selected implant species into the first region.

7. The method of claim 6, wherein the selected implant species comprises at least one of boron, boron difluoride, indium, $B_2H_6$, and Al.

8. The method of claim 6, wherein implanting the selected species comprises employing an acceleration voltage from about 0.5 to about 50 KeV.

9. The method of claim 6, wherein implanting the selected species comprises employing an implant dose of about $1.0 \times 10^{10}$ to about $4.0 \times 10^{14}$ atoms/cm$^2$.

10. The method of claim 6, wherein implanting the selected species comprises employing an implant angle of about 2 to about 82 degrees.

11. The method of claim 1, wherein counter-doping comprises in-situ doping a selected dopant into the first region.

12. The method of claim 11, wherein the selected dopant comprises at least one of boron, boron difluoride, indium, $B_2H_6$, and Al.

13. The method of claim 1, wherein the counter-doped first region comprises a doping profile.

14. The method of claim 13, wherein the doping profile comprises a uniform doping profile.

15. The method of claim 13, wherein the diode further comprises a second region and an interface between the first region and the second region, and wherein the doping profile has a peak in a vicinity of the interface.

16. The method of claim 1, wherein the first conductivity type is n-type and the second conductivity type is p-type.

17. The method of claim 1, wherein the first conductivity type is p-type and the second conductivity type is n-type.

18. The method of claim 1, wherein the diode comprises a p-n diode, a p-i-n diode, a punch-through diode, a Schottky diode, a back-to-back punch-through diode, or a back-to-back Schottky diode.

19. The method of claim 1, wherein the diode comprises an amorphous or polysilicon semiconductor material.

20. The method of claim 1, wherein the diode further comprises a second region and an interface between the first region and the second region, and wherein the method further comprises passivating the interface.

21. The method of claim 1, wherein the diode comprises a p-i-n diode, and the first region comprises an intrinsic region of the p-i-n diode.

22. The method of claim 21, wherein the first region comprises an unintentionally n-type doped intrinsic region of the p-i-n diode.

23. The method of claim 22, wherein counter-doping changes the unintentionally n-type doped intrinsic region to a lightly p-type doped intrinsic region of the p-i-n diode.

24. A memory cell formed using the method of claim 1.

25. A method of forming a memory cell, the method comprising:
    forming a diode including a first region having a first conductivity type;
    counter-doping the diode to change the first region to a second conductivity type; and
    forming a memory element coupled in series with the diode,
    wherein the diode includes a p-i-n diode, and the first region includes an intrinsic region of the diode.

26. The method of claim 25, wherein the diode comprises a vertical polysilicon diode.

27. The method of claim 25, wherein the memory element comprises a metal-insulator-metal ("MIM") stack.

28. The method of claim 27, wherein the MIM stack comprises a reversible resistance-switching element.

29. The method of claim 25, wherein the memory element comprises one or more of amorphous carbon containing nanocrystalline graphene, graphene, graphite, carbon nanotubes, amorphous diamond-like carbon, metal oxides, solid electrolyte, and phase change memory.

30. The method of claim 25, wherein counter-doping comprises implanting a selected implant species into the first region.

31. The method of claim 30, wherein the selected implant species comprises at least one of boron, boron difluoride, indium, $B_2H_6$, and Al.

32. The method of claim 30, wherein implanting the selected species comprises employing an acceleration voltage from about 0.5 to about 50 KeV.

33. The method of claim 30, wherein implanting the selected species comprises employing an implant dose of about $1.0 \times 10^{10}$ to about $4.0 \times 10^{14}$ atoms/cm$^2$.

34. The method of claim 30, wherein implanting the selected species comprises employing an implant angle of about 2 to about 82 degrees.

35. The method of claim 25, wherein counter-doping comprises in-situ doping a selected dopant into the first region.

36. The method of claim 35, wherein the selected dopant comprises at least one of boron, boron difluoride, indium, $B_2H_6$, and Al.

37. The method of claim 25, wherein the counter-doped first region comprises a doping profile.

38. The method of claim 37, wherein the doping profile comprises a uniform doping profile.

39. The method of claim 37, wherein the diode further comprises a second region and an interface between the first region and the second region, and wherein the doping profile has a peak in a vicinity of the interface.

40. The method of claim 25, wherein the first region comprises unintentionally doped semiconductor material.

41. The method of claim 25, wherein the first conductivity type is n-type and the second conductivity type is p-type.

42. The method of claim 25, wherein the first conductivity type is p-type and the second conductivity type is n-type.

43. The method of claim 25, wherein the diode comprises an amorphous or polysilicon semiconductor material.

44. The method of claim 25, wherein the diode further comprises a second region and an interface between the first region and the second region, and wherein the method further comprises passivating the interface.

45. The method of claim 25, wherein the first region comprises an unintentionally n-type doped intrinsic region of the p-i-n diode.

46. The method of claim 45, wherein counter-doping changes the unintentionally n-type doped intrinsic region to a lightly p-type doped intrinsic region of the p-i-n diode.

47. A memory cell formed using the method of claim 25.

* * * * *